(12) United States Patent
Dautriche

(10) Patent No.: US 6,184,752 B1
(45) Date of Patent: Feb. 6, 2001

(54) AMPLIFIER DEVICE WITH DIGITALLY CONTROLLABLE GAIN AND OPTICAL DISC READ APPARATUS INCORPORATING SUCH A DEVICE

(75) Inventor: Pierre Dautriche, Meylan (FR)

(73) Assignee: THOMSON multimedia, Boulogne (FR)

( * ) Notice: Under 35 U.S.C. 154(b), the term of this patent shall be extended for 0 days.

(21) Appl. No.: 09/413,393

(22) Filed: Oct. 6, 1999

(30) Foreign Application Priority Data

Oct. 6, 1998 (FR) .................................................. 98 12495

(51) Int. Cl.[7] ...................................................... H03G 3/10
(52) U.S. Cl. ........................ 330/278; 330/288; 250/214 A
(58) Field of Search ..................................... 330/278, 279, 330/288, 308; 250/214 A, 214 AG

(56) References Cited

U.S. PATENT DOCUMENTS

| | | | |
|---|---|---|---|
| 4,064,506 | 12/1977 | Cartwright, Jr. | 340/347 DA |
| 4,250,461 | 2/1981 | Limberg | 330/288 |
| 4,439,673 | 3/1984 | Gontowski, Jr. | 250/214 A |
| 4,485,301 | 11/1984 | Gontowski, Jr. | 250/214 A |
| 5,373,253 | * 12/1994 | Bailey et al. | 330/288 |
| 5,446,397 | * 8/1995 | Yotsuyanagi | 327/66 |
| 5,753,903 | * 5/1998 | Mahaney | 250/205 |

FOREIGN PATENT DOCUMENTS

| | | | |
|---|---|---|---|
| 0577265A2 | 1/1994 | (EP) | H03F/3/08 |
| 0840299A1 | 5/1998 | (EP) | G11B/7/09 |
| WO96/07927 | 3/1996 | (WO) | G01R/33/09 |

OTHER PUBLICATIONS

French Search Report citing the above–listed references: AA, AB, AC, AD, and AM.

* cited by examiner

Primary Examiner—Robert Pascal
Assistant Examiner—Henry Choe
(74) Attorney, Agent, or Firm—Joseph S. Tripoli; Paul P. Kiel

(57) ABSTRACT

The device has reference current sources ($T_{71}$, $T_{72}$, $T_{7M}$) which are arranged in such a way that the sum of the currents flowing through each of the said sources is equal to the input current ($I_{IN}$, $I'_{IN}$) and output current sources ($T_{81}$, $T_{82}$, $T_{8N}$), in each of which the current flowing through the reference sources is duplicated and which are arranged in such a way that the sum of the currents flowing through the output sources is equal to the output current ($I_{OUT}$, $I'_{OUT}$). The number of reference sources ($T_{71}$, $T_{72}$, $T_{7M}$) and output sources ($T_{81}$, $T_{82}$, $T_{8N}$) which are connected is controlled by the digital signal (200) and determines the gain of the device. Application to the circuit for processing the signals output by a read head of an optical disc reader apparatus.

9 Claims, 5 Drawing Sheets

US 6,184,752 B1

AMPLIFIER DEVICE WITH DIGITALLY CONTROLLABLE GAIN AND OPTICAL DISC READ APPARATUS INCORPORATING SUCH A DEVICE

BACKGROUND OF THE INVENTION

1 Field of the Invention

The present invention relates to an amplifier with digitally controlled gain and its application to a circuit for processing signals output by a read head of an optical disc reader apparatus.

2 Description of the Related Art

Referring to FIG. 1, information recorded on an optical disc 1 is read, in a manner which is known per se, by projecting a light beam 3 output by a laser diode 2 onto the reflective surface of the disc. The reflected beam 4 is detected by photodiodes A, B, C, D, E and F, the signals output by these photodiodes being used, inter alia, to decode the information stored on the optical disc. The photodiodes A to F, as well as the laser diode 2, form part of an optical and mechanical assembly 5 referred to as the read head of the apparatus, or optical pick-up, which does not form the subject-matter of the present invention and will not be described in further detail.

The signals output by the photodiodes A and C are added before being processed. The same is true of the signals output by the photodiodes B and D. Four signals S0 to S3 thus leave the read head 5 to be processed and decoded by a suitable processing circuit. In the case in point, the signals S0 to S3 correspond to the currents flowing through the photodiodes. These currents vary as a function of a certain number of factors, such as the reflectivity of the surface of the disc (depending on its state of cleanliness) or the power of the emitting laser diode 2.

Fixed-gain current/current amplifiers 10 to 13 receive the signals S0 to S3 and are connected to the four inputs E0 to E3 of a multiplexer 15. The output of the multiplexer 15 is connected to a resistor 16, which converts the current into voltage, and to the input of analogue/digital converter 18 which delivers a digital signal encoded using six bits to a digital circuit 25 for processing and decoding the signals emitted by the photodiodes.

In order to make maximum use of the dynamic range of the analogue/digital converter 18, and thus to deliver high-quality signals to the circuit 25, it is necessary for the signal entering the converter to have a sufficient amplitude. However, this amplitude depends directly on the current which is picked up by the photodiodes A to F. Depending on the type of read head which is used, the amplitude of the signal received by the analogue/digital converter 18 can vary from one to four times. These large variations are corrected by modifying the value of the resistor 16 as a function of the type of read head used. To that end, when the circuit for processing the signals output by the read head 5 is produced in integrated circuit form, a pin is provided on the circuit in order to make it possible to connect an external resistor 16 of suitable value to the read head.

However, the value of the resistor 16 is fixed for each given type of read head and does not make it possible to correct smaller but all the same significant variations in the current output by the photodiodes, which variations are due to the surface condition of the optical disc 1, which is not uniform (fingerprints, etc.) or the conditions under which the apparatus is being used (temperature, background light, etc.).

To solve this problem, it has been proposed in the prior art to modify the current flowing through the laser diode 2 as a function of the digital signal which is obtained at the output of the analogue/digital converter 18, so as to correct a decrease in the current output by the photodiodes by increasing the current in the laser diode, and vice versa. To do this, the digital signal output by the converter 18 is sent to the input of a digital/analogue converter 20, the analogue signal 8 resulting from the conversion being used to control the current in the laser diode 2.

However, this arrangement is unsatisfactory for the following reasons: on the one hand, it is necessary to add a digital/analogue converter 20, which increases the size of the assembly; on the other hand, the variations in the current in the laser diode lead to a significant reduction in its life.

It is furthermore known to use, in analogue/digital processing systems, a gain adjustment stage in order to match the amplitude of the incoming analogue signal to the dynamic range of the analogue/digital converters which are used in the processing system. FIGS. 2a to 2c illustrate different ways of adjusting the gain of an amplifier. In these figures, the amplifiers are voltage-controlled.

In FIG. 2a, an input signal $V_{IN1}$ is applied to one of the gates of a two-gate MOSFET transistor 36 whose drain is connected to a supply $V_{DD}$ via a resistor 34 and whose source is earthed. The drain of the transistor 36 is also connected to an operational amplifier 37, set up in follower mode, whose output is connected to the input of an analogue/digital converter 38 which delivers a digital signal to a digital processing circuit 35. In order to adjust the amplitude of the signal entering the converter 38, the transconductance of the transistor 36 will be modified by applying, to the second gate of the transistor, a control voltage $V_{COM1}$ coming from a return loop. The return loop is formed by a digital signal leaving the circuit 35 sent to a digital/analogue converter 39 whose output is connected to an operational amplifier 37', set up in follower mode, which delivers at an output the control voltage $V_{COM1}$. The problem with this device is that the gain does not vary linearly as a function of the control voltage throughout the adjustment range of the gain.

In FIG. 2b, elements which are identical have the same references as in FIG. 2a. In this device, the input signal $V_{IN2}$ is applied to a first non-inverting input of an operational amplifier 47 whose inverting input is earthed via a resistor 44 and which has a feedback loop connecting its output to its inverting input via a MOS transistor 46 set up in triode mode. The gain of the amplifier is modified by a control voltage $V_{COM2}$ (taken from the output of the operational amplifier 37') which modifies the value of the resistor formed by the MOS transistor 46. This device, although it makes it possible to obtain a more linear variation in the gain, nevertheless has stability problems due to the feedback loop formed by the MOS transistor.

Furthermore, as in the case of FIG. 2a, the voltage for controlling the gain comes from a digital/analogue converter 39 which occupies a large amount of space, in particular when the assembly is produced in integrated circuit form.

In the third case in FIG. 2c, a network of resistors 56 is placed in the feedback path of an amplifier 57 which receives the input signal $V_{IN3}$. The resistors 56 may or may not be connected in parallel using switching devices 59 which are controlled directly by a digital signal $V_{COM3}$ output by the digital processing circuit 35. The gain is adjusted by connecting a greater or lesser number of resistors in the feedback path. This device makes it possible, advantageously in comparison with the former two, to do away with a digital/analogue converter 39. However, it also has stability problems due to the existence of the feedback loop.

Because of the various problems explained above, the controlled-gain amplifiers of the prior art cannot be used satisfactorily in the systems for processing the signals S0 to S3 in FIG. 1 in order to adjust the amplitude of the signals delivered to the mulitplexer 15 and therefore to the analogue/digital converter 18.

SUMMARY OF THE INVENTION

The object of the invention is to solve the various problems which have been explained above.

To that end, it provides a variable-gain amplifier device controlled by a digital signal, which has:

an input stage for converting the input signal into an input current;

a first series of reference current sources which are arranged in such a way that the sum of the currents flowing through each of the said reference sources is equal to the input current;

a second series of output current sources, in each of which the current flowing through the first reference sources is duplicated and which are arranged in such a way that the sum of the currents flowing through the output sources is equal to the output current;

an output stage for converting the output current into an output signal.

According to the invention, the number of sources which are connected in the first and second series of current sources is controlled by the digital signal and determines the gain of the device.

The gain of the amplifier device is thus controlled directly by a digital signal and, since the device does not have a feedback loop, it is perfectly stable.

The invention also relates to an apparatus for reading optical discs, having a laser diode for emitting a light beam and photodiodes designed to pick up the light beam reflected by an optical disc when it is placed in the apparatus, the signals output by the photodiodes being processed in processing systems before being sent to an analogue/digital converter whose output is connected to a digital circuit. According to the invention, the processing systems of the apparatus have a variable-gain amplifier device controlled by a digital signal output by the circuit such as that described above for matching the signals sent to the input of the analogue/digital converter to the dynamic range of the converter.

According to another aspect of the invention, the current flowing through the laser diode of the apparatus is roughly constant. Its life is thus extended by this.

BRIEF DESCRIPTION OF THE DRAWINGS

Other characteristics and advantages of the invention will become apparent from the description below of several embodiments of the invention, which is given with reference to the appended drawings, in which.

DESCRIPTION OF THE PREFERRED EMBODIMENTS

Figure 3:
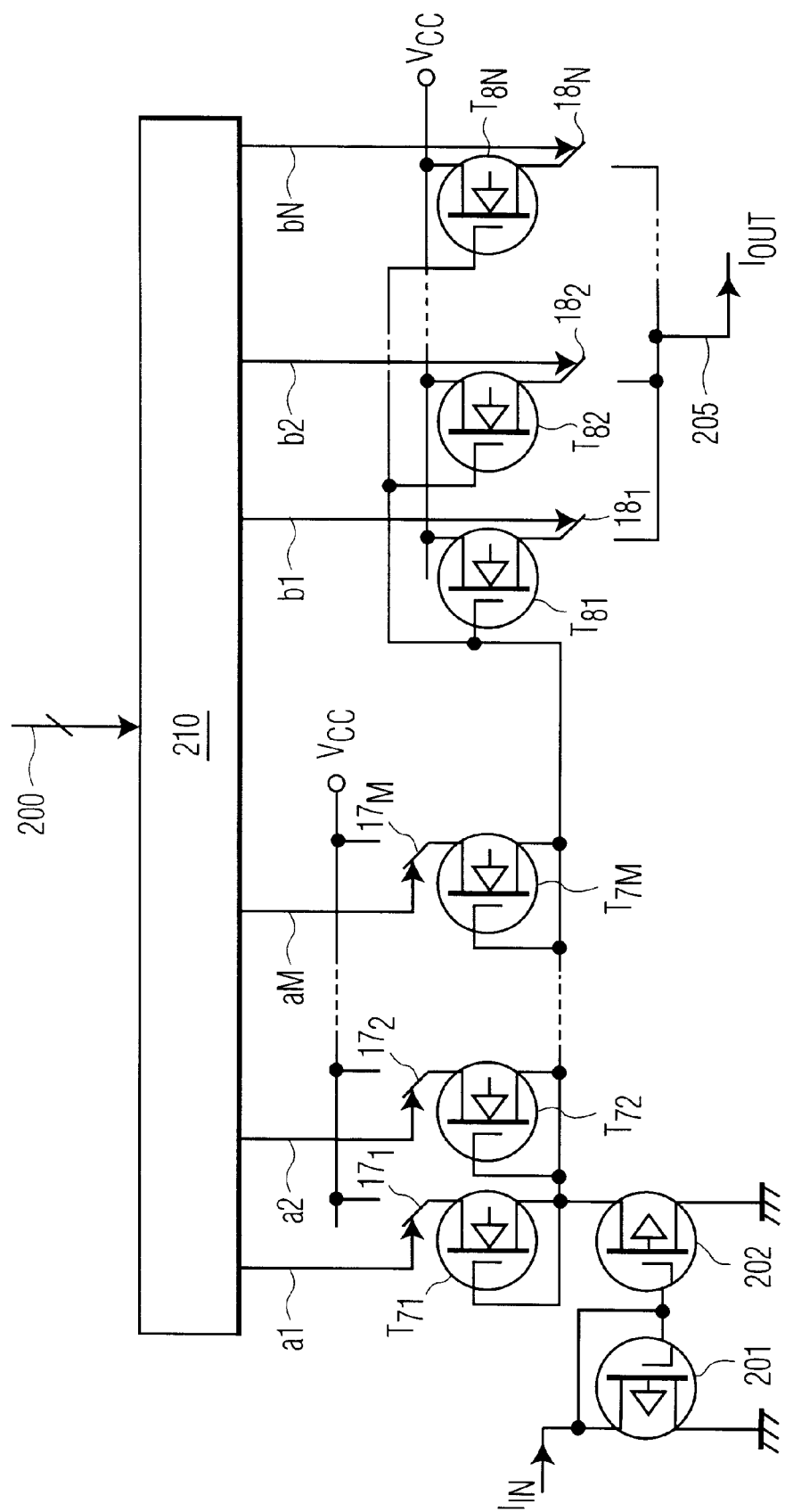
FIG. 3 represents an amplifier device with digitally controllable gain according to a first embodiment of the invention.

FIG. 3 represents a current/current amplifier which receives as input a current $I_{IN}$ and delivers as output a current $I_{OUT}$ as a function of a digital control signal 200. The input current $I_{IN}$ is applied to a current mirror formed by the N-channel MOS transistors 201 and 202. More precisely, the current $I_{IN}$ is applied to the drain of the transistor 201 which is connected to its gate, itself connected to the gate of the transistor 202. The drain-source current of the transistor 202 is therefore equal to $I_{IN}$.

A first series of M current sources which consist of P-channel MOS transistors $T_{71}, T_{72}, T_{7M}$ is arranged in such a way that the sum of the currents of these sources is equal to $I_{IN}$. All the gates of the transistors $T_{71}$ to $T_{7M}$ are connected respectively to the drains of the same transistors, which are themselves connected to the drain of the transistor 202. All the sources of the transistors $T_{71}$ to $T_{7M}$ are connected to a supply voltage $V_{CC}$ through a series of switches 171, 172, 17M. The switches 171 to 17M are controlled by respective binary instructions a1, a2, aM constructed on the basis of the digital control signal 200 by a control logic circuit 210.

The drain-source current of the transistor 202, which is equal to $I_{IN}$, is thus divided between the M current sources. If all the switches 171 to 17M are closed, the source-drain current flowing through each of the transistors $T_{71}$ to $T_{7M}$ is equal to $I_{IN}/M$. Conversely, if only two switches out of the M are closed, then the current flowing through the corresponding transistors is equal to $I_{IN}/2$.

A second series of N current sources which consist of P-channel MOS transistors $T_{81}, T_{82}, T_{8N}$ is arranged to form a current mirror with the first series of M sources. That is to say all the gates of the transistors Tel to $T_{8N}$ are connected to the common point of the gates and drains of the first transistor $T_{71}$ to $T_{7M}$. The sources of the transistors $T_{81}$ to $T_{8N}$ are connected to the supply voltage $V_{cc}$ and the drains of the transistors are each connected to a first terminal of a respective switch 181, 182, 18N, the second terminals of all the switches 181 to 18N being connected together to form a node to which a wire 205 delivering the output current of the amplifier $I_{OUT}$ is connected. The switches 181 to 18N are controlled by the respective binary instructions b1, b2, bN which are constructed on the basis of the digital control signal 200 by the control logic circuit 210.

The current flowing through the sources of the first series ($T_{71}$ to $T_{7M}$), which will be referred to below as reference sources, is duplicated in each of the sources of the second series, which will be referred to below as output sources. If m switches controlling the reference sources are closed, then the current flowing through each of the reference sources is equal to $I_{IN}/m$, and this current is duplicated in the output sources. If it is now assumed that n switches controlling the output sources are closed, the current delivered at the output of the amplifier is given by the following equation (1):

$$I_{OUT} = \frac{n}{m} \times I_{IN} \quad (1)$$

Figure 2A:
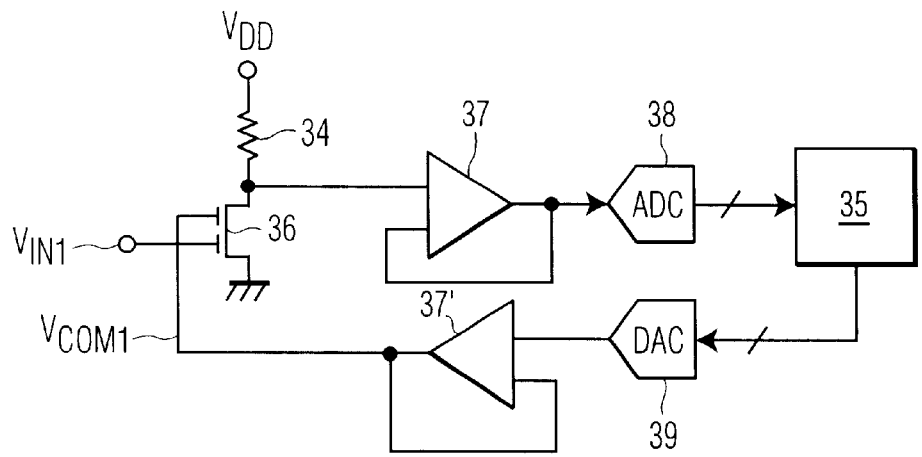
FIGS. 2a to 2c also described above, represent three analogue/digital processing systems of the prior art having a gain adjustment stage.
Figure 2B:
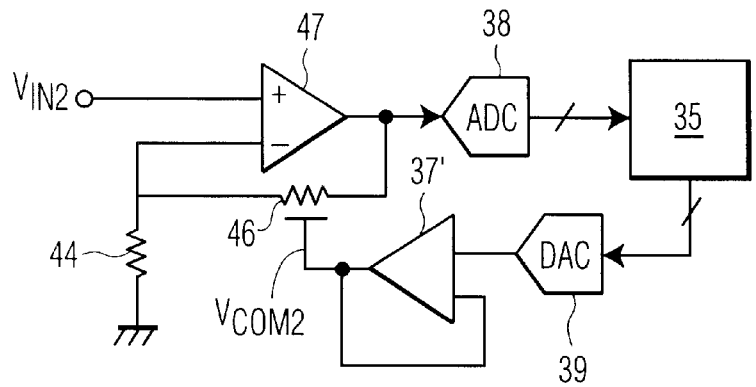
Figure 2C:
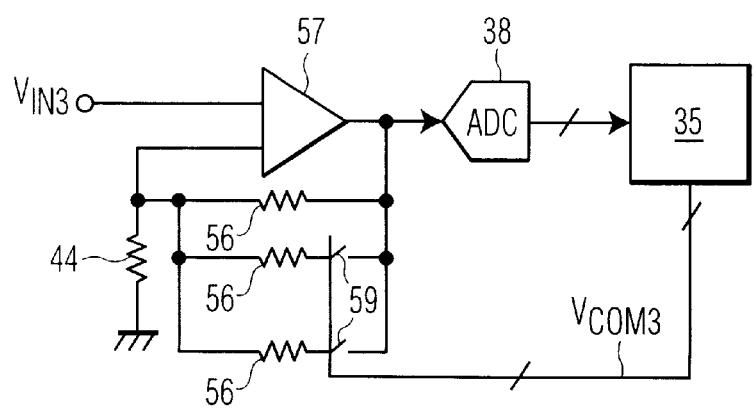

By modifying the numbers m and n appropriately, a variation in the gain of the amplifier is obtained. In comparison with the prior art amplifiers (in particular those represented in FIGS. 2b and 2c), the amplifier of the invention has no stability problem because it does not have any feedback loop.

It should be remembered that the purpose of the controlled-gain amplifier of the invention is to output a signal with quasi-constant amplitude corresponding to an optimum value allowing best use to be made of the dynamic range of an analogue/digital converter arranged at the output of the amplifier, whatever the amplitude of the input signal of the amplifier is.

In the example in FIG. 3, it is therefore necessary for the output current $I_{OUT}$ to be kept quasi-constant, whatever the value of $I_{IN}$ is. If $I_{IN}$ is small, the gain of the amplifier will have to be high, and n will need to be higher than m (referring to equation (1)). However, if $I_{IN}$ is large, the gain of the amplifier will have to be small and n will be chosen smaller than m. The number of closed switches out of the switches 171 to 17M controlling the reference sources will therefore vary inversely in relation to the number of closed switches out of the switches 181 to 18N controlling the output sources.

It is furthermore desirable to have a quasi-constant increment between two different values of the output current $I_{OUT}$ which are obtained for two consecutive codes of the digital control signal 200 when $I_{OUT}$ is closed to its optimum value. However, the minimum variation increment of $I_{OUT}$ corresponds to the current flowing through one of the output sources $T_{81}$ to $T_{8N}$, that is to say $I_{IN}/m$, assuming that m switches controlling the reference sources are closed. When the input current $I_{IN}$ varies, it is therefore possible to modify m in order to keep a quasi-constant minimum variation increment of $I_{OUT}$ It is also important to have a small variation increment, in particular when the system is close to the optimum setting of the gain.

It is an advantage of the present invention that it makes it possible to control the minimum variation increment of the output signal because, in the amplifier devices of the prior art, this increment very often depends on the manufacturing process and is not controllable. In particular, in the example in FIG. 2b, the increment depends on the variation in the value of the resistance formed by the MOS transistor 46 placed in the feedback loop, the accuracy of which is not always satisfactory.

A description of various control modes for the switches controlling the reference sources and the output sources will now be given.

In a first control mode, it is assumed that the digital control signal 200 is a signal encoded using $N_c$ bits. The number n of closed switches out of the control switches of the output sources varies linearly from 1 to $N_c$. The number m of closed switches controlling the reference sources varies in reverse to n from $N_c$ to 1 according to the following equation: $m = N_c - n + 1$. The output current of the amplifier is then:

$$I_{OUT} = \frac{n}{N_c - n + 1} I_{IN} \quad (2)$$

For a given application of the amplifier, it is desirable to have a current $I_{OUT} = I_0$ as output. The value of the number no which makes it possible to obtain this value as a function of the current $I_{IN}$ received at the input is given by equation (3) below:

$$n_0 = \frac{(N_c + 1)I_0}{I_{IN} + I_0} \quad (3)$$

Knowing that the number no has to be a natural integer, the integer part of the number given by equation (3) will be taken. The number of bits $N_c$ of the instruction will therefore be adapted as a function of the dynamic range of the input current $I_{IN}$, according to the precision which it is desired to obtain.

The variation in the output current as a function of the instruction code n is given by equation (4) below:

$$\frac{dI_{OUT}}{dn} = \frac{I_{IN}(N_c + 1)}{(N_c - n + 1)^2} \quad (4)$$

For a desired value of output current $I_{OUT} = I_0$, the variation increment of the output current as a function of the input current, calculated by replacing n in equation (4) with the value no given by equation (3), is therefore:

$$\frac{dI_0}{dn} = \frac{(I_{IN} + I_0)^2}{I_{IN}(N_c + 1)} \quad (5)$$

According to calculations made by the inventor, by choosing $N_c = 6$ bits and $I_0$ equal to 1, when the signal $I_{IN}$ varies from −20 dB to +20 dB relative to $I_0$ (that is to say from 0.01 to 100), the variation increment of the output current remains limited to 2 dB maximum.

In a second control mode, a digital control signal 200 encoded using 6 bits is used, that is to say one which can assume 64 different values. The number of reference sources is 64 (M=64) and the switches 171 to 17M are controlled thermometrically, that is to say by reducing the number of closed switches by 1 when the received code increases by 1. When the code "0" is received, all the reference sources are connected (all the switches 17x are closed) and when the code 63 is received, only one reference source is connected (only switch 171 is closed).

Conversely, the number of output sources is 6 (N=6), each being controlled by one of the bits of the control signal 200, and sources are used whose size is weighted as a function of the significance of the control bit. That is to say, for producing the output sources, MOS transistors $T_{81}$ to $T_{8N}$ are used whose channel width W/L (W and L being values characteristic of the width and the length of a MOS transistor gate) varies as a function of the significance of the control bit. Since the current passing through a MOS transistor is proportional to the width of its channel, the current flowing through each source $T_{8x}$ will therefore be equal to: $2^x I_{IN}/m$, assuming that $I_{IN}/m$ is the current through each of the reference sources. This can be summarized by Table 1 below:

TABLE 1

| Source  | $T_{81}$    | $T_{82}$     | $T_{83}$     | $T_{84}$     | $T_{85}$      | $T_{86}$      |
|---------|-------------|--------------|--------------|--------------|---------------|---------------|
| Current | $I_{IN}/m$  | $2\,I_{IN}/m$ | $4\,I_{IN}/m$ | $8\,I_{IN}/m$ | $16\,I_{IN}/m$ | $32\,I_{IN}/m$ |

Finally, the strategy for controlling the reference and output sources as a function of the code received in the signal 200 can be summarized in Table 2 below, in which the binary instructions a1 to aM and b1 to bN assume the value of "1" when the switch which they control is to be closed, and the value "0" when the switch is to be open.

TABLE 2

| Code received | Reference source instruction | | | | | | Output source instruction | | | | | $I_{OUT} =$ |
|---|---|---|---|---|---|---|---|---|---|---|---|---|
| | a64 | a63 | ... | a3 | a2 | a1 | b6 | ... | b3 | b2 | b1 | $f(I_{IN})$ |
| 0  | 1 | 1 | ... | 1 | 1 | 1 | 0 | ... |   | 0 | 0 | 0 |
| 1  | 0 | 1 | ... | 1 | 1 | 1 | 0 | ... | 0 | 0 | 1 | $I_{IN}/63$ |
| 2  | 0 | 0 | ... | 1 | 1 | 1 | 0 | ... | 0 | 1 | 0 | $(I_{IN}/62) \times 2$ |
| 3  | 0 | 0 | ... | 1 | 1 | 1 | 0 | ... | 0 | 1 | 1 | $(I_{IN}/61) \times 3$ |
| .  | . | . | .   | . | . | . | . | .   | . | . | . | . |
| .  | . | . | .   | . | . | . | . | .   | . | . | . | . |
| 61 | 0 | 0 | ... | 1 | 1 | 1 | 1 | ... | 1 | 0 | 1 | $(I_{IN}/3) \times 61$ |
| 62 | 0 | 0 | ... | 0 | 1 | 1 | 1 | ... | 1 | 1 | 0 | $(I_{IN}/2) \times 62$ |
| 63 | 0 | 0 | ... | 0 | 0 | 1 | 1 | ... | 1 | 1 | 1 | $I_{IN} \times 63$ |

It is clear that the largest codes will be used when $I_{IN}$ is the smallest, and consequently needs to be amplified, while the smallest codes will be used when $I_{IN}$ is large, the code "0" not being used in practice.

Other control modes may also be envisaged. In particular, the number of reference sources may be reduced in order to minimize the area of the circuit and simplify the control. Provision may also be made for a certain number of reference sources to remain permanently connected. What is required in practice is to find a compromise between the specifications expected of the circuit (expected output current $I_{OUT}$, maximum increment allowed in variation of the output current, etc.) and the size of the circuit as a function of the dynamic range of the input current.

Figure 4:
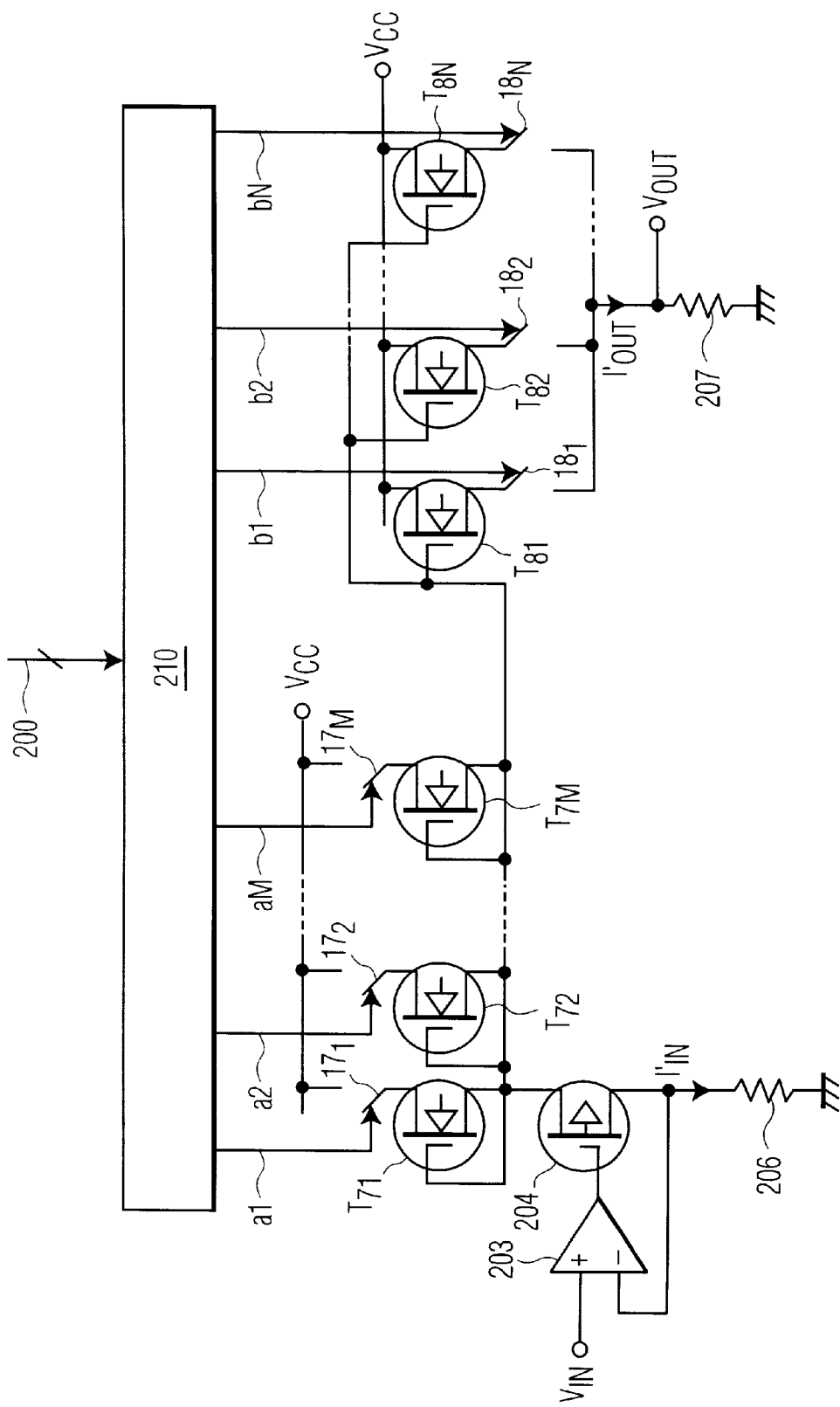
FIG. 4 represents an amplifier device with digitally controllable gain according to a second embodiment of the invention.

The amplifier which has just been described in conjunction with FIG. 3 is a current/current amplifier, but the principle of the invention is entirely applicable to a voltage/voltage amplifier. FIG. 4 represents such an amplifier, which receives an input voltage $V_{IN}$ and which delivers at its output a voltage $V_{OUT}$ which is a function of a digital control signal 200. All the elements which are identical to those in FIG. 3 have identical references, and will not be described further. Only the input and output stages differ from those in FIG. 3.

The voltage $V_{IN}$ is applied to the non-inverting input of an operational amplifier 203. The output of the amplifier is connected to the gate of an N-channel MOS transistor 204, while its inverting input is connected to the source of the transistor 204 and to the first terminal of a resistor 206, the second terminal of which is earthed. The voltage $V_{IN}$ is therefore also found across the terminals of the resistor 206 through which a current $I'_{IN}$ proportional to $V_{IN}$ flows, this current $I'_{IN}$ also being equal to the drain-source current of the transistor 204. This transistor 204 fulfils the same function as the transistor 202 of the amplifier represented in FIG. 3.

At the output, the current $I_{OUT}$ passes through a resistor 207, one terminal of which is earthed in order, at the other terminal of the resistor, to deliver the output voltage $V_{OUT}$. In other regards, the way in which the amplifier in FIG. 4 operates is identical to that in FIG. 3.

Figure 1:
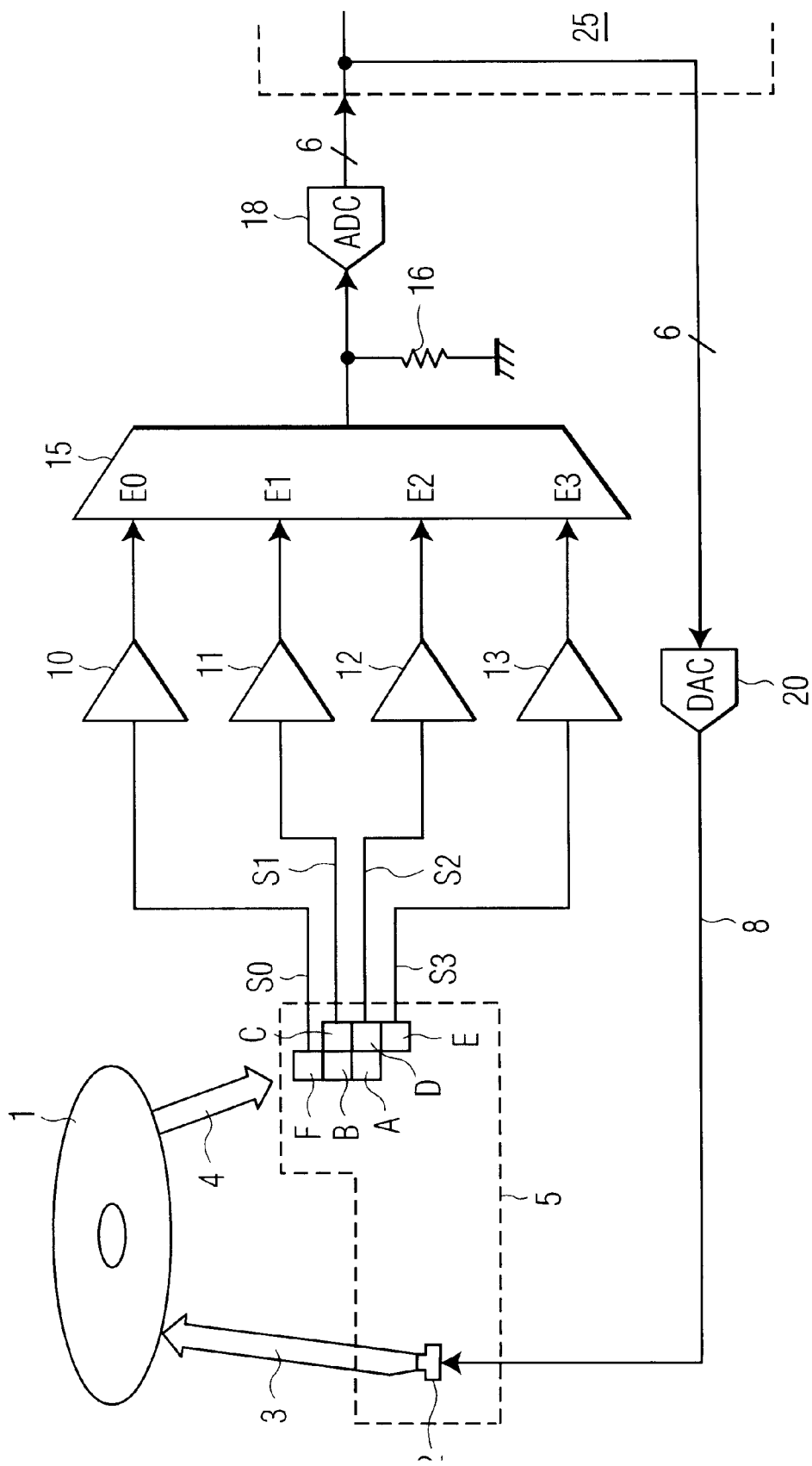
FIG. 1 already described above, schematically illustrates a part of an optical disc reader apparatus according to the prior art.
Figure 5:
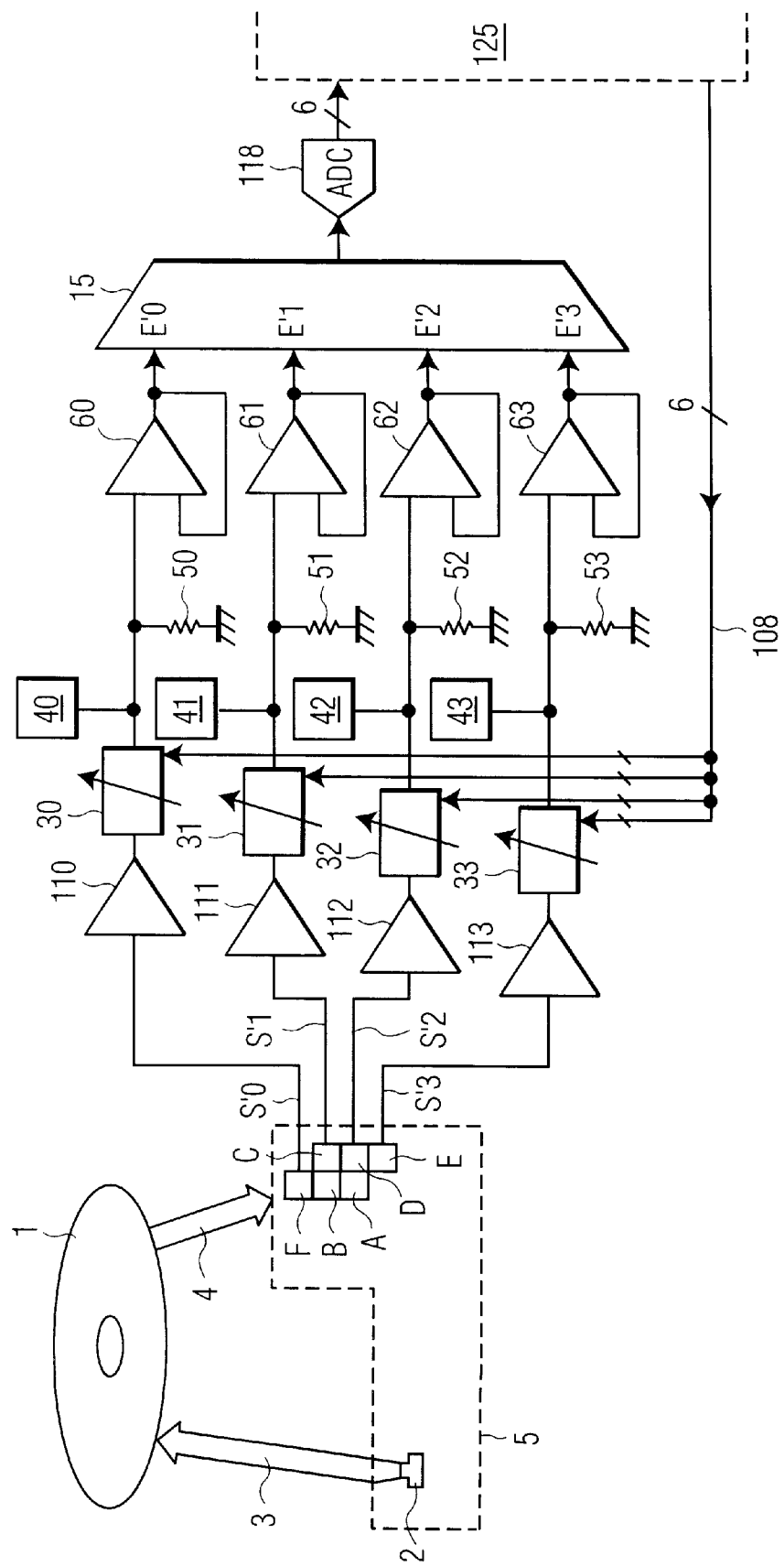
FIG. 5 illustrates a part of an optical disc reader apparatus implementing the invention.

FIG. 5 represents a part of an optical disc reader device which advantageously incorporates the amplifier which was described in FIG. 3. Elements which are similar to those in FIG. 1 which has already been described have the same references and will not be described again.

The read head 5 delivers four signals S'0, S'1, S'2 and S'3 which correspond to the currents output by the photodiodes A to F. These signals are processed in four identical processing systems which lead to the four inputs E'0, E'1, E'2 and E'3 of a multiplexer 115.

The processing systems each have a fixed-gain current/current amplifier 110 to 113, followed by a controlled-gain amplifier 30 to 33 such as the one which is described in FIG. 3, a circuit 40 to 43 controlling the offset of the signal which is arranged at the output of the controlled-gain amplifier, and a resistor 50 to 53 which makes it possible to convert the current into voltage in order to apply it to an operational amplifier 60 to 63, set up in follower mode, whose output is connected to the input E'0 to E'3 of the multiplexer 115. The output of the multiplexer 115, which is a voltage signal, is sent to the input of an analogue/digital converter 118 which delivers a digital signal encoded using 6 bits to a digital circuit 125 for processing and decoding the signals output by the photodiodes.

The operational amplifiers 60 to 63 which are arranged at the end of the systems for processing the signals S'0 to S'3 fulfil the function of buffers to prevent mixing, or crosstalk, between the channels of the multiplexer 115. It will be noted that, in contrast to the prior art device represented in FIG. 1, the current/voltage conversion of the signals S'0 to S'3 is carried out before the signals are multiplexed. This is because, since the variable-gain amplifiers 30–33 make it possible to modify the amplitude of the signals directly in the processing system, it is no longer necessary to provide an external resistor whose value is selected according to the type of read head. There are several advantages with this: on the one hand, it limits the number of resistor references needed for manufacturing the device, and on the other hand it restricts the noise in the signal in comparison with the solution in which the resistor is external, this noise being created by the difference in earth potentials between the internal earth of the circuit and the external earth.

The controlled-gain amplifiers 30–33 make it possible both to correct the variations in amplitude of the signals S'0–S'3 which are due to the different types of read heads used, and those which are due to the surface condition of the optical disc 1 or other factors. Since the amplifiers 30–33 are controlled directly by a digital control signal 108, constructed by the circuit 125 as a function of the signal received from the analogue/digital converter 118, it is no longer necessary to provide an extra digital/analogue converter, and it is furthermore no longer necessary to vary the current through the laser diode 2. The circuit is therefore more compact and the laser diode 2, whose current is kept constant, has a longer life than in the prior art.

The invention is not of course limited to the embodiments which have been described above, and encompasses all variants. In particular, the amplifier with digitally controlled gain as described in FIG. 3 can be used in applications other than the circuit for processing the signals output by a read head of an optical disc reader. In particular, it can be used in the processing of video signals or audio signals output by tuners.

What is claimed is:

1. A variable-gain amplifier device receiving an input signal and being controlled by a digital signal, comprises:
    an input stage for converting the input signal into an input current;
    a first series of reference current sources which are arranged in such a way that the sum of the currents flowing through each of said reference sources is equal to the input current;
    a second series of output current sources, in each of which the current flowing through the first reference sources is duplicated and which are arranged in such a way that the sum of the currents flowing through the output sources is equal to the output current;
    an output stage for converting the output current into an output signal;
    wherein the number of sources which are connected in the first and second series of current sources is controlled by said digital signal and determines the gain of said device.

2. The device according to claim 1, further comprising first switches which are arranged in series with the reference current sources, and second switches which are arranged in series with the output current sources, the opening and closing of said switches being controlled by binary instructions constructed by a control logic circuit on the basis of said digital signal.

3. The device according to claim 2, wherein said reference current sources comprise P-channel MOS transistors, all of whose gates and all of whose drains are connected together and whose sources are connected to said first control switches, the output current sources comprising P-channel MOS transistors, all of whose gates are connected together and to the common point of the gates and drains of the reference sources and whose sources are connected to said second control switches.

4. The device according to claim 2, wherein the number (m) of closed switches out of those controlling the reference current sources is inversely proportional to the number (n) of closed switches out of those controlling the output sources.

5. The device according to claim 4, wherein the digital control signal being encoded using $N_c$ bits, the number n of closed switches out of those controlling the output current sources varies from 1 to $N_c$, while the number m of closed switches out of those controlling the reference current sources varies from $N_c$ to 1 according to the equation $m=N_c-n+1$.

6. The device according to claim 2, wherein the output current sources are each controlled by one bit of said digital control signal, the size of the sources being weighted as a function of the significance of the bit of said control signal.

7. The device according to claim 6, wherein the digital control signal is encoded using 6 bits, the first series of reference current sources comprising 64 sources of the same size, and wherein the second series of output sources comprises 6 sources of sizes weighted by the significance of the bit of the control signal.

8. An apparatus for reading optical discs, comprising a laser diode for emitting a light beam and photodiodes designed to pick up the light beam reflected by an optical disc when it is placed in the apparatus, the signals output by the photodiodes being processed in processing systems before being sent to an analogue/digital converter whose output is connected to a digital circuit, wherein said processing systems have a variable-gain amplifier device controlled by a digital signal output by the circuit according to claim 1 for matching the signals sent to the input of the analogue/digital converter to the dynamic range of said converter.

9. The apparatus according to claim 8, wherein the current flowing through the laser diode (2) is roughly constant.

* * * * *